United States Patent [19]

Allara et al.

[11] Patent Number: 4,690,715

[45] Date of Patent: Sep. 1, 1987

[54] MODIFICATION OF THE PROPERTIES OF METALS

[75] Inventors: David L. Allara, Florham Park; Ralph G. Nuzzo, Summit, both of N.J.

[73] Assignee: American Telephone and Telegraph Company, AT&T Bell Laboratories, Murray Hill, N.J.

[21] Appl. No.: 389,775

[22] Filed: Jun. 18, 1982

[51] Int. Cl.$^4$ .......................... C23C 22/08; B03D 3/10
[52] U.S. Cl. .............. 148/6.15 R; 148/6.17; 148/6.24; 427/250; 427/255.4; 427/302; 427/304; 427/305; 427/306; 427/327; 427/399; 427/404; 427/405; 427/409; 427/412.1; 427/444
[58] Field of Search .............. 427/304, 305, 255.4, 427/404, 405, 306, 250, 328, 327, 444, 302, 399, 409, 412.1; 148/6.15 R, 6.17, 6.24

[56] References Cited

U.S. PATENT DOCUMENTS

| | | | |
|---|---|---|---|
| Re. 29,039 | 11/1976 | Andrews | 427/305 |
| 3,222,218 | 12/1965 | Beltzer et al. | 427/304 |
| 3,224,908 | 12/1965 | Duch et al. | 148/6.15 R |
| 3,320,115 | 5/1967 | Reid et al. | 427/302 |
| 3,367,792 | 2/1968 | Levine | 427/305 |
| 3,770,513 | 11/1973 | Wystrach | 148/6.15 R |
| 4,059,473 | 11/1977 | Okami | 427/302 |
| 4,063,004 | 12/1977 | Quinn | 427/304 |
| 4,298,636 | 11/1981 | Künzig | 427/305 |
| 4,301,190 | 11/1981 | Feldstein | 427/305 |

*Primary Examiner*—Norman Morgenstern
*Assistant Examiner*—Janyce A. Bell
*Attorney, Agent, or Firm*—Bruce S. Schneider

[57] ABSTRACT

The use of modifiers such as disulfides and phosphines is particularly effective in modifying the properties of metals such as noble metals and silver. For example, disulfides are useful for modifying the properties of gold and silver while phosphines are useful for metals such as platinum and palladium. Through treatment with a suitable modifier it is possible to change properties such as the wetting and adhesion properties of the treated metal. Additionally, the use of modifiers to treat a desired substrate enhances formation of continuous metal films on this substrate.

22 Claims, 1 Drawing Figure

U.S. Patent  Sep. 1, 1987  4,690,715
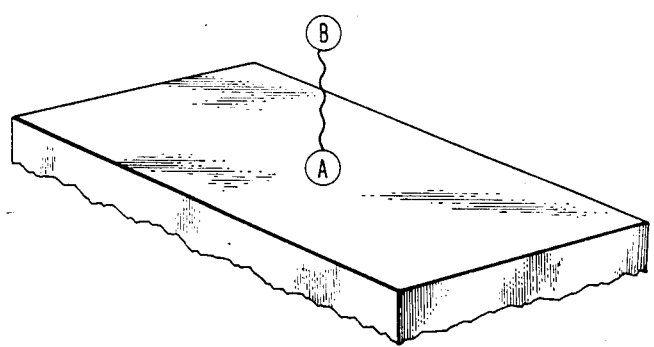

MODIFICATION OF THE PROPERTIES OF METALS

BACKGROUND OF THE INVENTION

1. Field of the Invention

This invention relates to the properties of metals and more particularly to the properties of metal layers.

2. Art Background

The chemical and physical properties of metals, e.g., the inertness of noble metals such as gold, platinum, and palladium, have made metals useful in a variety of applications. Often, however, the use of one desirable property of a metal in a specific application is precluded by other properties of the metals or by the very property which is deemed desirable. For example, although chemical inertness makes noble metals such as gold quite useful for many applications, e.g., electrical contacts, it also significantly increases both the difficulty involved in fabricating components which include these metals and increases the difficulty involved in adapting these metals for specific uses. In particular, thin-film gold contacts are employed in many electronic components. The use and fabrication of these contacts presents the problem of depositing a continuous, adherent gold film on a desired substrate which will withstand the abrasion typically endured during use. Generally, to limit the abrasion experienced and to lengthen lifetime the contacts are lubricated. However, the inert character of the gold not only reduces adhesion of the film to the substrate but also often precludes wetting of the film by the lubricant. Thus, in this situation the property of the metal which makes it desirable also makes it difficult to use.

For each individual problem encountered in the use of metals such as noble metals, an individual procedure for reducing or eliminating this difficulty has been developed. This case-by-case approach is further necessitated by the requirement that the process employed to overcome the problem being addressed does not in turn degrade the desirable properties of the metal. In accordance with this case-by-case approach, various methods have been evolved for plating materials such as oxides or plastics with a metal film having useful electrical conductivity. (See, for example, *Modern Electrochemistry*, F. A. Lowenheim, Ed., John Wiley & Sons, New York, 1974.) The particular plating procedure employed significantly depends on the composition of the substrate material, on the particular metal being deposited, and the ultimate use of the deposited metal. A single unifying approach which allows the solution of a large variety of problems encountered by utilization of metals such as noble metals has not been developed.

SUMMARY OF THE INVENTION

A unified approach for solving many problems encountered in the use of metals involves employing an extremely small amount of a modifying organic compound. This modifying compound is chosen to have a reactive moiety, including at least one nitrogen, phosphorous, oxygen, or sulfur bearing functionality which reacts with a particular metal and at least a second reactive moiety, i.e., a reactive organic functional group, which produces or leads to the property modification desired to overcome the problem being considered. Since the modifier need only be present in quantities as small as or smaller than a monolayer to produce the desired effect, the modifier typically does not adversely affect the desirable properties of the metal. The inventive approach includes suitable modifiers even for inert metals such as gold.

The invention is useful in two generic situations. In the first situation, a substrate is treated with a compound which has organic functional groups that chemically bond to the substrate. The treating compound is chosen to also have a moiety including at least one nitrogen, phosphorous, oxygen, and/or sulfur bearing functionality which reacts with the metal or a precursor used to deposit the metal. Upon such deposition, the metal layer forms a relatively continuous, adherent metal layer even in situations where the metal does not normally adhere and/or does not normally form a continuous layer on the untreated substrate. The exact mechanism for the improved results is not clear. However, it is contemplated that the interaction of the metal with the nitrogen, phosphorous, oxygen, or sulfur containing moiety causes homogeneous nucleation on the substrate which, in turn, causes formation of a continuous adherent film. As an example of the first generic aspect of the invention, if the substituents on the disulfide are chosen to react with a substrate material, it is possible to first bond the disulfide to the substrate through reaction with the organic substituents. This treatment produces a substrate having unreacted disulfide entities. When gold is deposited by procedures such as thermal evaporation on the treated substrate, the gold reacts with the disulfide and produces an adherent continuous layer on the substrate for even very thin (between 70 and 150 Å) deposited layers. In contrast without the inventive treatment such thin continuous layers are not obtained.

Similarly, phosphines are employable with noble metals such as platinum and palladium in the same manner that disulfides are utilized. Neither the treatment with the phosphorous or sulfur containing compounds, e.g., the phosphine or disulfide compound, substantially affects the desirable properties, e.g., low electrical resistance and chemical inertness, of the treated metal. The flexibility of the inventive approach is also shown in deposition of metals such as aluminum. When aluminum is deposited by chemical vapor deposition (CVD) from an aluminum trialkyl vapor onto a silicon substrate with a silicon oxide coating, a grainy, patchy deposition is obtained. However, through the use of a nitrogen containing compound—an amine—having organic functional groups, such as a monoethoxysilyl group, which react with the substrate being coated, continuous thin films of aluminum are obtained. The silyl group reacts with the substrate and the aluminum trialkyl reacts with the amine moiety to yield the desired results.

In a second situation, the properties of a metal film of an inert metal including, for example, gold platinum, silver and palladium are modified by employing a disulfide or phosphine compound having organic functional groups. The disulfide or the phosphine bonds to the metal. The organic functional groups are chosen to give a desired property. For example, a fluorocarbon functional group is chosen to make the metal surface difficult to wet. Specific examples of the inventive process are the interaction of (1) metals such as gold and silver with a disulfide having reactive organic functional group(s), and (2) metals such as platinum and palladium with phosphines or disulfides having reactive organic functional group(s). The sulfur atoms in an organic disulfide material readily, chemically bond to gold, platinum, palladium, or silver. The organic functional groups remaining in this bonded disulfide are employed to modify the properties of the metal. For example, if a gold surface is treated with a material such as trans-o-dithiane-4,5-diol, the gold surface becomes wettable with a lubricating material such as low molecular weight polyphenylene oxide. The sulfur atoms react with the gold and anchor the modifier to it. The lubricant interacts with the —OH moieties of the modifier inducing the lubricant to spread on the modified gold surface. In fact, it is possible to dissolve an appropriate disulfide in the lubricant and treat the gold with a single application. This procedure also simplifies retreatment of newly formed gold surfaces produced by the inevitable occurrence of mechanical abrasion.

A wide variety of reactive phosphorous, nitrogen, oxygen, and sulfur containing compounds having various organic functional groups are either commercially available or are easily synthesized from commercially available materials. The reactivity of various functional groups with a multitude of materials has been investigated and is well known. Therefore, through the use of compounds such as disulfides, it is possible to adapt metals such as gold, silver, platinum, and palladium to an equally wide variety of uses. Thus, a simple, unified approach for overcoming a variety of difficulties involved in the use of metals such as the inert metals while maintaining their attributes is made available.

BRIEF DESCRIPTION OF THE DRAWING

The FIGURE is illustrative of the inventive process.

DETAILED DESCRIPTION

The properties of metals—even noble metals—are considerably altered through the use of appropriate modifiers, compounds having at least one phosphorous, nitrogen, oxygen, and sulfur reactive group, e.g., disulfides, phosphines, carboxylic acids, and amines that also have reactive organic functional groups. The particular modifier employed depends on the particular property to be modified. For pedagogic purposes two cases will be individually discussed. In the first case, a substrate is modified to affect the properties of a metal deposited upon it. In the second case, a metal surface is modified to affect its properties. Additionally for pedagogic reasons, the discussion of the first case will involve inert metals, and aluminum due to their importance in significant industries, such as the electronics industry. However, the invention in the first case is not limited to these metals or the modifiers employed with these metals. Irrespective of the situation, a molecule is employed which has one region that is reactive with the metal or the metal species responsible for the metal layer formation in the case of metal deposition, i.e., a phosphorous, nitrogen, oxygen or sulfur containing moiety such as a phosphine, a disulfide, a carboxylic acid, or an amine, and one region, i.e., a region containing reactive-organic functional group(s), which provides the properties desired for the particular application—the Case I or Case II application. For gold, silver, platinum or palladium, a disulfide, i.e., —S—S— is advantageously employed. For noble metals, such as platinum and palladium, a phosphine is also advantageously employable, and in Case I for aluminum an amine is useful.

The particular reactive organic functional group(s) employed in these modifiers are not critical. The reactive groups are chosen so that they yield the desired properties for the contemplated application. However, there are some minor limitations on the choice of functional group. Obviously, very unstable functional groups should generally be avoided. For example, organic functional groups which are destroyed by subsequent processing utilized in a particular application is typically not desirable. Additionally, organic groups that themselves react with the entities which react with the metal, e.g., sulfur of the disulfide or the phosphorus of the phosphine, should also be avoided. Suitable modifiers include cyclical disulfide compounds such as trans-o-dithiane-4,5-diol (TDD) and its derivatives, aliphatic disulfides such as 3,3'-dithiodiproprionic acid (DTA) and aromatic containing entities such as 5,5'-dithiobis[2-nitrobenzoic acid] (DTNA).

One additional structural requisite is applicable to the phosphines. In the case of phosphines the noble metal reacts (chelates) with the phosphine to form a complex such as

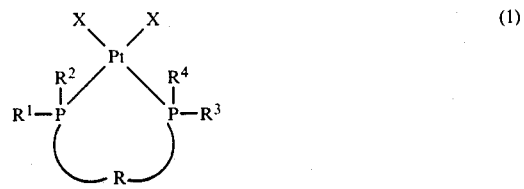

The substituent R is chosen so that it contains an appropriate reactive group for the application and so that upon complexing with the noble metal a 5 to 9 member ring is formed. $R^1$, $R^2$, $R^3$ and $R^4$ are typically alkyl, substituted alkyl or aromatic substituents and X are substituents as defined below. Other substituents although useful, generally make the phosphorous atoms reactive with oxygen and thus produce some inconvenience. To avoid steric problems the $R^1$, $R^2$, $R^3$ and $R^4$ substituents should have a cone angle less than 180 degrees. (See C. A. Tolman, *Chemical Reviews*, 77, 313 (1977) for a definition of cone angle.) For example, phosphines such as

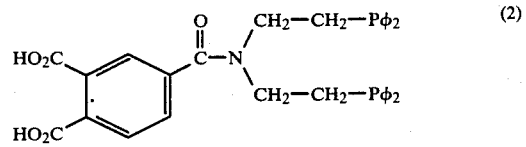

or

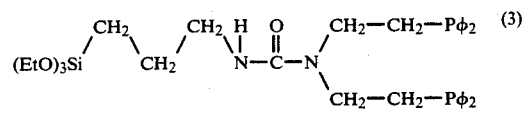

are employable which react with species present during processes such as electroless plating, to form surface complexes such as

where X is a ligand such as a halogen, alkyl, nitrate or a variety of other ligands as discussed in *The Organometallic and Coordination Chemistry of Platinum*, U. Beleuco, Academic Press, New York, (1974). (See R. G. Nuzzo et al., *Journal of Organic Chemistry*, 46, 2861 (1981) for a general procedure for synthesizing such phosphines.) The spatial position of the reactive functional group in the R substituent is not critical. It is possible for this functional group to be bound directly to the chain containing the phosphorus atoms or to be bound to a moiety which in turn is bound to the phosphorus-containing chain. Again as in the case of disulfides, aliphatic substituents, aromatic substituents and cyclic substituents are all employable. Amine compounds such as

$$EtO(Me)_2Si(CH_2)_3NH_2 \tag{5}$$

are also useful. As in the other previously discussed modifiers, aliphatic substituents, aromatic substituents, and cyclic substituents are also useful.

Once the modifier is chosen, the surface to be treated is contacted with it. In one embodiment, the surface is simply immersed in this compound. Alternatively, if the compound is a solid or if the compound is extremely expensive and only small amounts are available, the surface to be treated is immersed in a solution containing the compound. (It is also possible to employ a mixture of treating compounds.) Although other means of treatment, i.e., vapor exposure, are not precluded, the use of an immersive technique generally produces a desirable homogeneous coating of the treated surface. The concentration of the treating compound, i.e., modifier, required per unit area of surface is relatively small. Typically, a modifier coverage of from $10^{13}$ to $10^{15}$ molecules per cm$^2$ of real surface area (as opposed to the geometric area) is useful for the average size molecule of interest. (A coverage of approximately $10^{14}$ molecules per cm$^2$ for an average size molecule represents a monolayer.) Lesser coverage than $10^{13}$ leads to a loss of modifier efficiency while greater coverage than $10^{15}$ generally produces multiple layers of the modifier with the possibility of decreased mechanical performance. In such multilayer structures, if the modifier-modifier interaction is weak, so is the structure itself irrespective of the strength of the substrate-modifier bond. Generally solutions having concentrations in the range 0.10M to 0.001M are employed to yield a suitable coverage.

PARTICULAR APPLICATIONS

1. Case I Situation

In the situation where a metal layer is to be formed on a substrate through conventional techniques such as thermal evaporation, CVD, or electroless plating, the treating compound—the modifier—is chosen to have a functional group (A in FIG. 1) which reacts with this substrate. For example, if a metal layer is to be deposited by thermal evaporation onto a substrate having a silicon oxide surface, a modifier such as

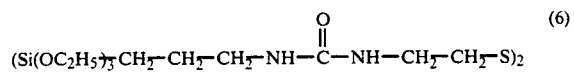

$$(Si(OC_2H_5)_3CH_2-CH_2-CH_2-NH-\overset{O}{\overset{\|}{C}}-NH-CH_2-CH_2-S)_2 \tag{6}$$

is employed. As a further example, the use of DTA allows an adherent gold or silver film to be deposited onto an Al$_2$O$_3$ surface of a substrate. In either of these exemplary situations the inventive concept is employed. The sulfur entities (B in FIG. 1) react with the gold being deposited such as by thermal evaporation and the functional group, Si(OC$_2$H$_5$)$_3$ in the former case and COOH in the latter case, reacts with the substrate. The result is a continuous gold or silver layer even when thin films—as thin as 70 Å are formed. This film has excellent electrical properties, i.e., resistivities approaching those of the bulk metal. Additionally, it is possible to deposit a film that is sufficiently thin so that it is optically transmissive and useful in products such as optically transparent electrodes.

Similarly, the R entity of the phosphines is chosen to react with the surface of the substrate upon which the metal film is to be deposited. For example, the compound depicted previously as compound (2), is employed so that a continuous reflective platinum or palladium film is producible on an Al$_2$O$_3$ surface. The carboxylic acid functional groups react with the Al$_2$O$_3$ and the two phosphorus atoms of the phosphine chelate with a noble metal species. It is contemplated that this organo-metallic complex produces a dense, uniform distribution of nucleation sites which lead to continuous films deposited by a procedure such as electroless plating. After the initial film is formed, it is possible to deposit by procedures such as electroless plating a thicker film of the same or a different bulk metal onto the already formed organo/metal film.

As a further example, a substrate such as silicon with an oxide coating is treated with an amine such as that shown in compound (5). Deposition of Al by CVD from an aluminum trialkyl is then initiated. (See Malazgirt and Evans, *Metallurgical Transactions* B, 11B, 225 (1980) for a description of such a deposition process.) The functional group, i.e., the silyl group, causes the modifier to remain on the substrate and the interaction of the amine with the aluminum trialkyl forms spatially uniform nucleation sites which in turn cause a continuous, Al film to form.

2. Case II Situation

In the second situation, as previously discussed, a metal surface is modified to yield a desired property. For example, the disulfide or the phosphine moiety in this situation represented by (A in FIG. 1) is employed to react with the metal surface while functional groups (in this situation B in FIG. 1) on these disulfides or phosphines are utilized to afford the desired properties. If it is desired, to produce a surface having waxy characteristics on a gold film without modifying the electrical properties of this film, a material such as

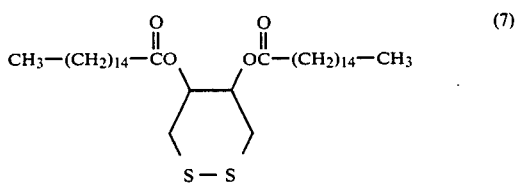

is employed. The disulfide reacts with the gold and the

group yields the wax-like properties. In the same vein,

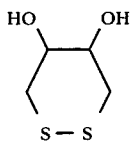

yields a surface that is wettable with water, and

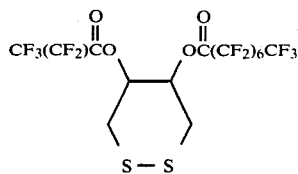

and

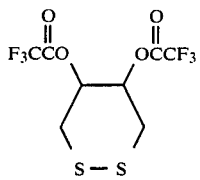

yield surfaces which has properties characteristic of fluorocarbons. (Compounds (7), (10) and (11) are all derivatives of commercially available compound (9) and are made by acylation of the parent diol—compound (9).) A similar approach is possible with phosphines or disulfides where the phosphorus or sulfur atoms react with noble metals such as palladium and platinum and where a fluorocarbon functional group yields the desired properties such as a barrier to the creeping of silicon oil layers onto a metal surface whose function is impeded by the oil.

In the previous cases the modifier itself imparts the desired properties to the inert metal. However, it is possible to employ functional groups on the modifier which do not provide the desired property but which interact in turn with a composition which does. For example, a modifier such as that represented by compound (9) interacts with a lubricant such as polyphenylene oxide to yield a lubricated inert metal surface.

TREATMENT OF SUBSTRATES IN SELECTIVE AREAS

In the situation where a metal layer is to be formed on a substrate, it is possible through the use of the inventive process to deposit the metal layer in a desired pattern. This result is accomplished by (1) choosing a substrate, e.g., a metal oxide, which in its untreated form is substantially less wetted by the metal to be deposited than the treated substrate during a given deposition time and by (2) employing a non-ballistic (e.g., electroless plating) deposition procedure. For kinetic reasons the metal nucleates and forms a film in the treated regions before any substantial nucleation and film formation occurs in the untreated regions. The pattern is formed by treating the substrate with the desired modifier only in regions where the metal is to be deposited. This selective treatment is accomplished in one advantageous procedure by first treating the entire surface of the substrate in the region to be patterned. The modifier is then destroyed in areas where the metal film is not desired by irradiating it with actinic radiation, e.g., an electron beam or light. Electron beams having an energy greater than 100 V generally cause decomposition of the modifier and therefore render it inoperative. Similarly, it is possible to employ light which causes photolysis of the compound. For example, if the compound represented by compound (2) is employed, an electron beam having an energy of approximately 20 KeV is useful to cause its decomposition.

After selective treatment of the substrate is achieved, the metal is deposited on the treated substrate by conventional techniques such as electroless deposition. The metal then preferentially wets the surface in the modified area and thus produces the desired pattern.

The following examples are illustrative of the inventive process.

EXAMPLE 1

A single crystal silicon wafer oriented in the (111) plane, two inches in diameter was employed as the substrate. The wafer was cleaned in a mixture of 30 percent aqueous hydrogen peroxide and concentrated sulfuric acid where the volume ratio was approximately 20:80. The wafer was sequentially rinsed in three aliquots of distilled water and one aliquot of electronic grade methanol. The wafer was blown dry with purified nitrogen gas.

A tungsten boat of an evaporation apparatus was charged with aluminum having a purity of 99.999 percent. The cleaned substrate was positioned on the sample holder of this evaporation apparatus and the apparatus was evacuated to a pressure of approximately $1 \times 10^{-7}$ Torr. The tungsten boat was resistively heated, to produce a flux of aluminum and a shutter between the tungsten boat and the substrate was removed. The heating was continued at a sufficient level so that an aluminum deposition rate on the substrate of between 10 to 30 Å/second was obtained. The deposition was continued until a deposited aluminum thickness of approximately 1500 Å was achieved. The shutter was then closed and the apparatus was backfilled with purified oxygen. The substrate with its aluminum layer was maintained in the oxygen atmosphere for several minutes to yield a native aluminum oxide film.

A second cleaned silicon wafer was coated with a layer of $Al_2O_3$ by electron beam deposition. The deposition was accomplished by placing the substrate in the sample holder of an electron beam deposition apparatus. A target of crystalline $Al_2O_3$ (sapphire) measuring approximately 0.5 cm in diameter was utilized. This target was impacted with an electron beam flux having a potential of approximately 10 KeV. The flux was adjusted to yield a deposition rate of approximately 5 Å a second. A shutter between the substrate and the target was removed and deposition was continued until a deposited sapphire layer thickness between 150 and 300 Å was obtained. The shutter was then inserted between the substrate and the target. The apparatus was backfilled with purified nitrogen.

The sample substrates were held over (but not immersed in) a beaker of warm water to slightly moisten them. (The moisture helps somewhat in the bonding of the modifier to the substrate.) The samples were then immersed in a 0.01 molar ethanol solution of DTA for approximately 1 minute. The samples were removed and rinsed with acetone. The samples were then allowed to dry in air. Gold was evaporated onto the treated substrates by the same evaporation procedure as earlier described for the deposition of aluminum. The deposition was contained until a gold layer thickness of approximately 1500 Å was obtained. The gold formed an adherent continuous film on the substrate. This film remained adherent after placing a piece of transparent tape on its surface and subsequently removing the tape. The aluminum oxide separated from the underlying silicon before the gold separated from the aluminum oxide. Corresponding samples which did not have the modifier treatment all had gold layers which peeled at the gold/$Al_2O_3$ interface during the tape test.

EXAMPLE 2

The procedure of Example 1 was followed except a silicon dioxide layer was produced on the silicon wafer rather than an aluminum oxide layer. This silicon dioxide layer was a native oxide layer typically present on a silicon wafer which has been exposed to air. Additionally, a second sample was prepared by using a SiO substrate purchased from Ted Pella, Incorporated (Tustin, Calif.). This substrate was further coated with an additional layer of SiO having a thickness of approximately 170 Å with an electron beam deposition procedure as described in Example 1 for the deposition of $Al_2O_3$. (The surface of SiO behaves in essentially the same manner as the surface of $SiO_2$.) Both substrates were immersed in a 0.01 molar methylene chloride solution of the compound represented by the formula

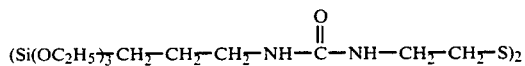

The substrates were then removed from the solution and rinsed in methylene chloride. The substrates were further dried in air for approximately 5 minutes. A 1500 Å thick layer of gold was then deposited onto the $SiO_2$ substrate as described in Example 1. Various thicknesses (up to 300 Å) of gold were deposited onto SiO samples by the same procedure. The $SiO_2$ on silicon sample was subjected to the tape test which it passed. Again, the untreated samples failed. The SiO sample was examined by transmission electron microscopy which showed a continuous layer of gold. Samples without the modifier treatment did not show continuous films.

EXAMPLE 3

A silicon substrate having a layer of electron beam deposited $Al_2O_3$ was prepared as described in Example 1. The substrate was immersed for approximately 1 minute in a 0.01 molar ether solution of the compound represented by the formula of compound (2). The substrate was removed from the solution, rinsed in ether, and allowed to dry in air.

The substrate was then immersed in an electroless plating solution for platinum. This solution was a 0.1 molar solution of dimethyl(1,5-cyclooctadiene) platinum (II) in diethylether. The immersed substrates were kept in the solution and placed in an environment having one atmosphere pressure of hydrogen gas. The immersed substrate was left in this environment for approximately 30 minutes to yield a deposited platinum layer having a thickness on the order of a tenth of a micron. The substrate was removed from the plating solution, rinsed in diethylether, and allowed to dry in air. An adherent continuous layer was formed.

The film, which visually appeared shiny, was viewed by scanning electron microscopy and appeared quite smooth. A similar procedure was followed except the modifier treatment was omitted. The film obtained by this procedure as viewed visually was dull and dark and as viewed by scanning electron microscopy was patchy and rough.

EXAMPLE 4

A coated silicon oxide substrate was prepared as described in Example 2. The silicon oxide coating was in turn coated with 150 Å of $Al_2O_3$ which was deposited by electron beam deposition by the procedure described in Example 1. This substrate was then treated as described in Example 3. The platinum plating procedure was terminated sufficiently soon to yield a platinum thickness that was thin enough to be observed by transmission electron microscopy. By such observation, it was discerned that the platinum layer was continuous and densely packed. A similar sample was prepared by the same procedure except the treatment with the modifier was omitted. This sample as observed by transmission electron microscopy was sparsely and irregularly nucleated.

EXAMPLE 5

The procedures of Example 1 and 2 were followed except instead of depositing a gold layer onto the treated substrates a silver layer was deposited. This silver layer was deposited by evaporation under the same conditions described for the gold deposition. A continuous, adherent layer of silver was observed.

EXAMPLE 6

A silicon monoxide substrate having an overlying aluminum oxide layer was prepared as described in Example 4. This substrate was treated as described in Example 1 with DTA. A gold layer having a thickness of less than 150 Å was deposited onto the treated substrate by the evaporation procedure described in Example 1. A plurality of substrates were treated and samples were prepared with gold layer thicknesses between 25 and 150 Å. Similarly, samples having a silver layer thickness between 25 and 150 Å were prepared. Gold and silver layers in this thickness range were also prepared on untreated substrates. Each sample was observed by transmission electron microscopy. The films having thicknesses greater than 70 Å in the treated samples were continuous and had conductivities approaching bulk metal while the films on the untreated samples were not continuous and were as much as $10^8$ times less conductive. For evaporation of layers less than 70 Å the treated samples were significantly more densely nucleated and had higher connectivity than the corresponding untreated sample.

EXAMPLE 7

A layer of gold (approximately 1500 Å that had been thermally evaporated onto a substrate was treated in 0.01 molar acetone solution of the compound represented by compound (9). The gold layer was left immersed in the solution for approximately 1 minute. The treated film was rinsed in acetone and allowed to dry. A lubricant including polyphenylene oxide was dropped onto the treated gold surface. The lubricant uniformly spread within minutes onto the gold surface. In contrast, when the lubricant was dropped onto an untreated sample, it took several hours for it to spread.

EXAMPLE 8

The procedure of Example 7 was followed except an electroplated gold layer was employed. The treated sample was wetted by the lubricant but the untreated sample was not wetted even generally after long time periods. (A very few untreated samples did exhibit some wetting after long time exposure to the lubricant.)

What is claimed is:

1. A process for fabricating a metal layer on a substrate comprising the steps of
   (1) treating said substrate with a modifier, said modifier comprising a compound having (a) an organic functional group which interacts with the surface of said substrate to form a chemical bond and (b) a reactive moiety, and
   (2) forming a layer of said metal on said treated substrate wherein said reactive moiety reacts with the species of said metal used in said formation.
2. The process of claim 1 wherein said reactive moiety includes N, P, O or S.
3. The process of claim 1 wherein said modifier comprises a disulfide.
4. The process of claim 3 wherein said modifier comprises trans-o-dithiane-4,5-diol.
5. The process of claim 1 wherein said modifier comprises a phosphine.
6. The process of claim 5 wherein said phosphine comprises

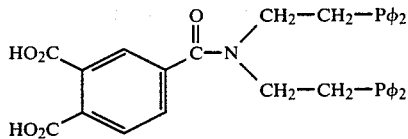

7. The process of claim 1 wherein the modifier is present on the substrate in a concentration in the range $10^{13}$ to $10^{15}$ molecules/cm$^2$.
8. The process of claim 1 wherein the surface of said substrate comprises a silicon oxide.
9. The process of claim 1 wherein the surface of said substrate comprises $Al_2O_3$.
10. The process of claim 1 wherein said metal comprises a noble metal.
11. The process of claim 1 wherein said metal comprises a member of the group consisting of gold, silver, aluminum, platinum and palladium.
12. The process of claim 1 wherein said layer formation is by electroless plating.
13. The process of claim 1 wherein said modifier comprises an amine and said layer formation is accomplished by decomposition of an aluminum trialkyl at said substrate.
14. The process of claim 1 wherein said layer formation is accomplished using evaporation.
15. A process for modifying the properties of a noble metal containing surface comprising the steps of treating said surface with an organic modifier comprising (a) a reactive portion that reacts with said metal through a moiety containing a member of the group consisting of P and S, and (b) a moiety which provides said change of properties.
16. The process of claim 15 wherein said modifier comprises a disulfide.
17. The process of claim 16 wherein said modifier comprises trans-o-dithiane-4,5-diol.
18. The process of claim 15 wherein said modifier comprises a phosphine.
19. The process of claim 15 wherein said noble metal comprises a member of the group consisting of gold, platinum, palladium and silver.
20. The process of claim 15 wherein the modifier is present of the substrate in a concentration in the range $10^{13}$ to $10^{15}$ molecules/cm$^2$.
21. The process of claim 15 wherein said modifier changes the wetting properties of said noble metal.
22. The process of claim 15 wherein said metal comprises gold.

* * * * *

UNITED STATES PATENT AND TRADEMARK OFFICE
CERTIFICATE OF CORRECTION

PATENT NO. : 4,690,715

DATED : September 1, 1987

INVENTOR(S) : David L. Allara and Ralph G. Nuzzo

It is certified that error appears in the above-identified patent and that said Letters Patent is hereby corrected as shown below:

Column 9, line 1, "contained" should read --continued--.

Signed and Sealed this

Ninth Day of February, 1988

Attest:

DONALD J. QUIGG

Attesting Officer

Commissioner of Patents and Trademarks